United States Patent
Park et al.

(10) Patent No.: US 10,009,041 B2
(45) Date of Patent: Jun. 26, 2018

(54) BCH DECORDER IN WHICH FOLDED MULTIPLIER IS EQUIPPED

(71) Applicant: Korea University Research and Business Foundation, Seoul (KR)

(72) Inventors: Jongsun Park, Seoul (KR); Hoyoung Tang, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days. days.

(21) Appl. No.: 15/221,083

(22) Filed: Jul. 27, 2016

(65) Prior Publication Data

US 2017/0288700 A1    Oct. 5, 2017

(30) Foreign Application Priority Data

Apr. 1, 2016  (KR) .................. 10-2016-0039975

(51) Int. Cl.
| | | |
|---|---|---|
| *H03M 13/15* | (2006.01) | |
| *H03M 13/29* | (2006.01) | |
| *H03M 13/37* | (2006.01) | |
| *H03M 13/17* | (2006.01) | |
| *H03M 13/11* | (2006.01) | |

(52) U.S. Cl.
CPC ..... *H03M 13/152* (2013.01); *H03M 13/1105* (2013.01); *H03M 13/1545* (2013.01); *H03M 13/17* (2013.01); *H03M 13/2927* (2013.01); *H03M 13/37* (2013.01)

(58) Field of Classification Search
CPC ........... H03M 13/152; H03M 13/1545; H03M 13/2927; H03M 13/1105; H03M 13/37; H03M 13/17

USPC .................................................. 714/782, 799
See application file for complete search history.

(56) References Cited

U.S. PATENT DOCUMENTS

| | | | | |
|---|---|---|---|---|
| 7,206,992 B2* | 4/2007 | Xin | ..................... | H03M 13/152 714/704 |
| 7,823,050 B2* | 10/2010 | Gasanov | ............. | H03M 13/152 714/752 |
| 8,621,329 B2* | 12/2013 | Panteleev | ........... | H03M 13/152 714/774 |

(Continued)

FOREIGN PATENT DOCUMENTS

KR     101307792 B1    9/2013

OTHER PUBLICATIONS

Park et al., "High-Speed Low-Complexity Reed-Solomon Decoder using Pipelined Berlekamp-Massey Algorithm and Its Folded Architecture," Journal of Semiconductor Technology and Science (Sep. 2010); 10(3):193-202.

*Primary Examiner* — John J Tabone, Jr.
(74) *Attorney, Agent, or Firm* — Fox Rothschild LLP

(57) ABSTRACT

Provided is a BCH decoder in which a folded multiplier is equipped. The BCH decoder may include a key equation solver including a plurality of multipliers. The multiplier includes a plurality of calculation blocks configured to perform a calculation operation. Each of the calculation blocks repeatedly performs a calculation operation of a calculation stage for a plurality of calculation stages, outputs one output value on the basis of at least one input value in each calculation stage, and is connected to at least one another calculation block to transfer an output value of a current calculation stage as an input value of the at least one another calculation block in a next calculation stage.

10 Claims, 7 Drawing Sheets

(56) References Cited

U.S. PATENT DOCUMENTS

| | | | | |
|---|---|---|---|---|
| 9,032,277 B1* | 5/2015 | Langhammer | .... | H03M 13/1585 |
| | | | | 714/781 |
| 2004/0177312 A1* | 9/2004 | Xin | ...... | H03M 13/15 |
| | | | | 714/782 |
| 2008/0155381 A1* | 6/2008 | Gasanov | ........... | H03M 13/152 |
| | | | | 714/782 |
| 2009/0070656 A1* | 3/2009 | Jo | ....... | G06F 11/1068 |
| | | | | 714/763 |
| 2010/0042907 A1* | 2/2010 | Pilsl | ........ | H03M 13/152 |
| | | | | 714/782 |
| 2010/0058146 A1* | 3/2010 | Weingarten | ...... | H03M 13/1515 |
| | | | | 714/773 |
| 2010/0174970 A1* | 7/2010 | Goldberg | .......... | H03M 13/152 |
| | | | | 714/785 |
| 2010/0257433 A1* | 10/2010 | Weingarten | ....... | G06F 11/1068 |
| | | | | 714/782 |
| 2010/0299580 A1* | 11/2010 | Neznanov | .......... | H03M 13/151 |
| | | | | 714/782 |
| 2011/0239094 A1* | 9/2011 | Kwok | ..... | G06F 7/724 |
| | | | | 714/782 |
| 2012/0054586 A1* | 3/2012 | Panteleev | ......... | H03M 13/152 |
| | | | | 714/785 |
| 2014/0095960 A1* | 4/2014 | Chu | ......... | H03M 13/152 |
| | | | | 714/763 |
| 2014/0195881 A1* | 7/2014 | Srivastava | ........... | H03M 13/15 |
| | | | | 714/782 |
| 2016/0329911 A1* | 11/2016 | Zhang | ............. | H03M 13/1545 |
| 2016/0359502 A1* | 12/2016 | Lin | ..... | H03M 13/152 |
| 2017/0093433 A1* | 3/2017 | Ilani | .......... | H03M 13/153 |
| 2017/0155407 A1* | 6/2017 | Lin | ........ | H03M 13/152 |
| 2017/0179980 A1* | 6/2017 | Lin | .......... | H03M 13/2963 |
| 2017/0187391 A1* | 6/2017 | Ilani | ......... | H03M 13/153 |
| 2017/0222662 A1* | 8/2017 | Kumar | .............. | H03M 13/1177 |

* cited by examiner

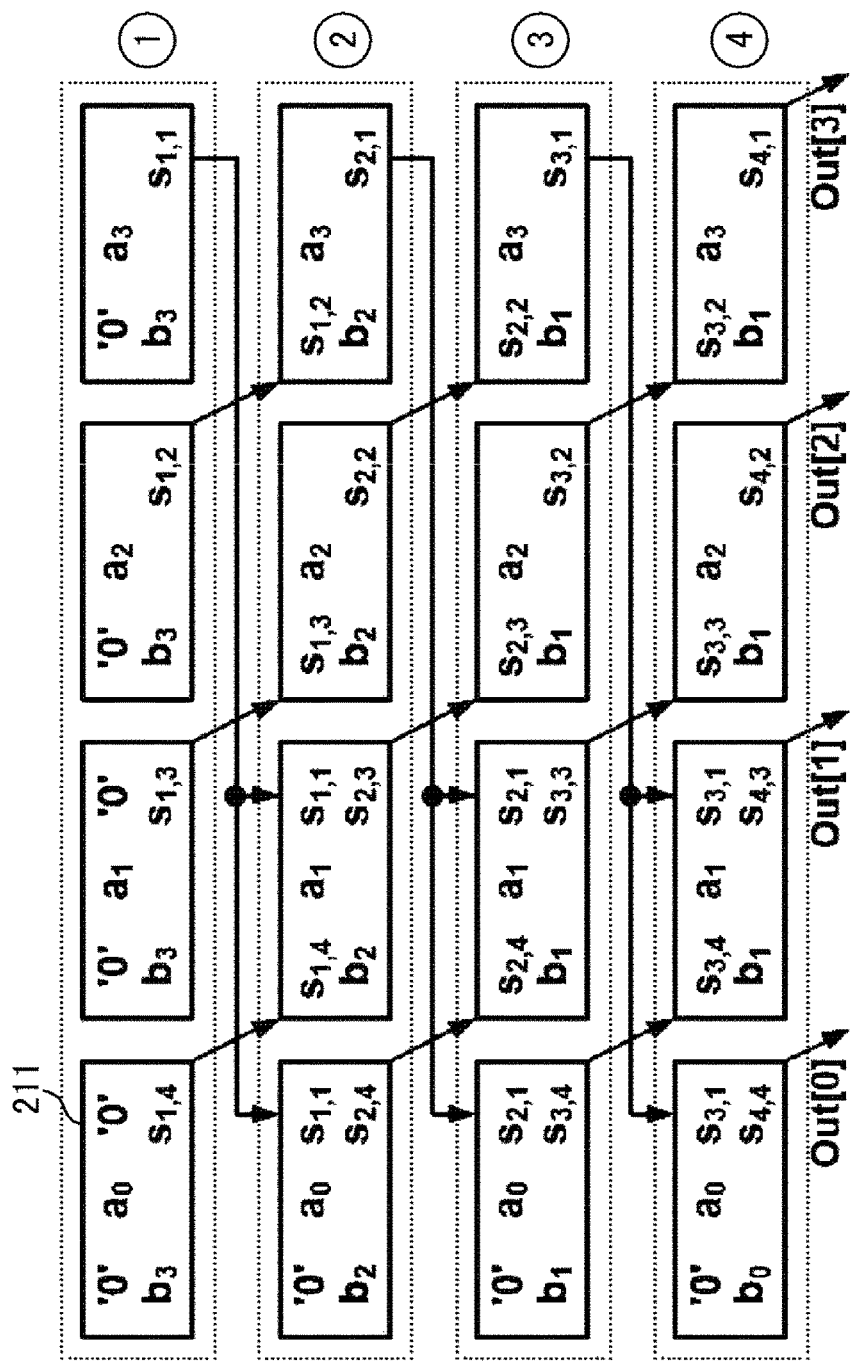

BCH DECODER IN WHICH FOLDED MULTIPLIER IS EQUIPPED

CROSS-REFERENCE TO RELATED APPLICATION

This application claims the benefit under 35 USC 119(a) of Korean Patent Application No. 10-2016-0039975 filed on Apr. 1, 2016, in the Korean Intellectual Property Office, the entire disclosures of which are incorporated herein by reference for all purposes.

TECHNICAL FIELD

The present disclosure relates to a BCH decoder in which a folded multiplier is equipped. More particularly, the present disclosure relates to a BCH decoder in which a multiplier implemented with a folded structure is equipped within a KES (Key Equation Solver) in order to improve an operation speed of the BCH decoder.

BACKGROUND

A storage device such as a NAND flash memory and a communication system configured to perform digital transmission need to perform an error correction process to a message being processed. To this end, a BCH (Bose-Chaudhuri-Hocquenghem) code as one of error correction codes is used. By way of example, a NAND flash memory encodes a message to be stored into a BCH code using a BCH encoder and then stores the BCH code in a memory, and decodes the BCH code read from the memory using a BCH decoder and then outputs the original message.

In general, error correction using a BCH algorithm includes generating BCH code data using the BCH encoder and then decoding the BCH code data using the BCH decoder. In this case, the BCH code data are decoded as follows. If the BCH code data are received by the BCH decoder, syndromes are calculated and an error locator polynomial is generated using the syndromes. Then, the root of the error locator polynomial is extracted to calculate the locations of error bits. In case of decoding binary BCH code data, an error can be corrected by inverting the bit value of an error bit.

The BCH decoder includes a KES (Key Equation Solver). However, the KES has limited operation speed when it is implemented in the conventional architecture. Thus, the KES module has been a major obstacle when the BCH decoder is operated at a high operation frequency and a high calculation speed. A conventional KES includes a GF (Galois Field) multiplier as illustrated in FIG. 1. Such a conventional GF multiplier includes a lot of duplicated calculation processes and has a long critical path delay. Thus, the conventional GF multiplier has a low calculation speed caused by a low operation frequency. Therefore, the conventional KES has been an impediment to implementation of a high operation speed of the BCH decoder. Further, the GF multiplier has a structure which cannot be folded and thus inevitably occupies most of the area of the KES.

SUMMARY

The present disclosure is conceived to solve the above-described problem of the prior art, and provides a BCH decoder in which folded multipliers constituting a KES are equipped in order to improve an operation speed of the BCH decoder and also reduce the area of the KES.

Provided is a BCH decoder in which a folded multiplier is equipped herein. The BCH decoder may include a key equation solver. The key equation solver includes a plurality of multipliers. The multiplier includes a plurality of calculation blocks configured to perform a calculation operation. Each of the calculation blocks repeatedly performs a calculation operation of a calculation stage for a plurality of calculation stages, outputs one output value on the basis of at least one input value in each calculation stage, and is connected to at least one another calculation block to transfer an output value of a current calculation stage as an input value of the at least one another calculation block in a next calculation stage.

In the prior art, circuits of a multiplier are very irregularly aligned, and thus the multiplier cannot be implemented with a folded structure. However, in some scenarios, calculation blocks constituting a multiplier are converted into a regular combination structure to perform a calculation. Thus, the multiplier can be folded, which is impossible in the prior art. Accordingly, the present solution can solve the limitation in an operation frequency of the conventional KES caused by an irregular structure and a complicated calculation method. As a result, a critical path of the KES can be shortened.

In some scenarios, a calculation speed bottleneck in the KES can be solved by increasing an operation frequency, and thus an overall calculation speed of the BCH decoder can be increased. Further, an operation frequency can be uniformly maintained even if a GF dimension is increased, which is very advantageous in implementation of a high-speed operation of the BCH decoder. Furthermore, the number of calculation blocks is minimized. Therefore, the area of the multiplier can be reduced, and thus the overall area of the BCH decoder can be minimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, the present solution is described as illustrations only since various changes and modifications will become apparent to those skilled in the art from the following detailed description. The use of the same reference numbers in different figures indicates similar or identical items.

FIG. 6 is a diagram illustrating a circuit structure of a multiplier including calculation blocks.

FIG. 7A illustrates a circuit structure when a coefficient of primitive polynomial element is 0. FIG. 7B illustrates a circuit structure when a coefficient of primitive polynomial element is 1.

DETAILED DESCRIPTION

Figure 1:
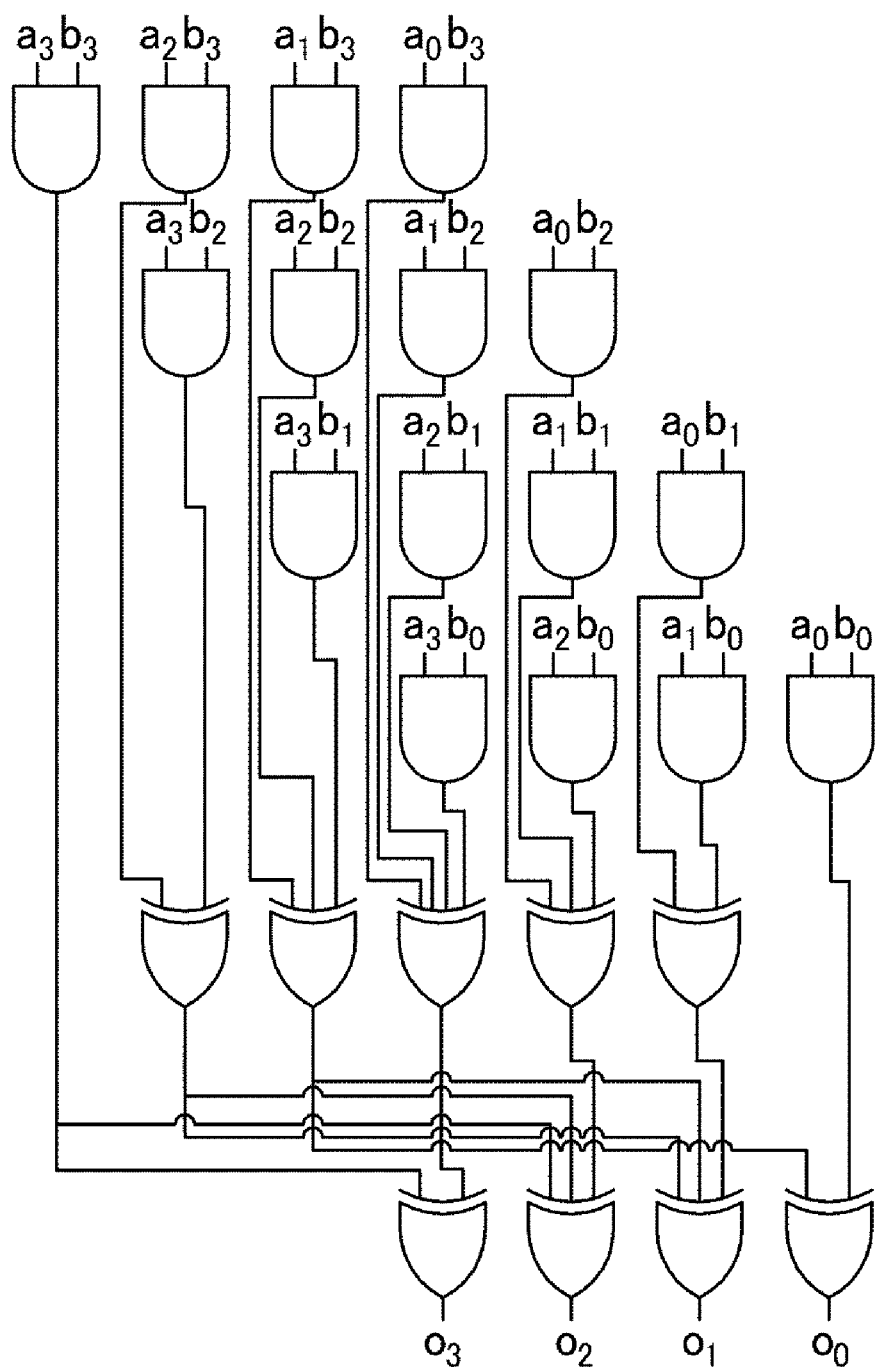
FIG. 1 is a conceptual diagram of an unfoldable circuit structure of a multiplier within a KES (Key Equation Solver) according to the prior art.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise.

Figure 2:
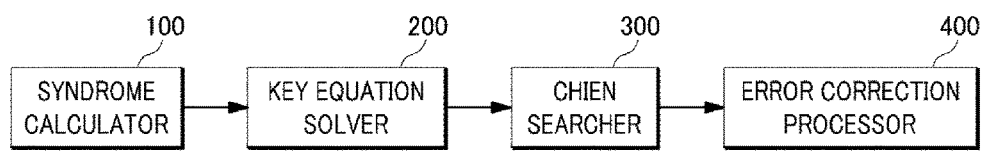
FIG. 2 is a diagram illustrating a structure of a BCH decoder.

A structure of a BCH decoder will be described in detail with reference to FIG. 2.

A BCH decoder 10 includes a syndrome calculator 100, a key equation solver 200, a Chien searcher 300, and an error correction processor 400.

The syndrome calculator 100 is a module configured to perform a syndrome calculation to received data to check whether or not an error occurs.

The key equation solver 200 is a module configured to calculate a key equation when an error is found from the data received by a syndrome generator. Herein, the key equation may also be referred to as an error location polynomial.

The Chien searcher 300 is a module configured to extract the root of the key equation and search a location of the error. In this case, the Chien searcher 300 may use a Chien search algorithm.

The error correction processor 400 is a module configured to correct the error of the received data with reference to the error location searched by the Chien searcher 300.

In some scenarios, the present solution provides the BCH decoder 10 in which a multiplier constituting the key equation solver 200 is implemented with a folded structure, and thus circuit complexity is reduced and an operation frequency is improved as compared with a case using a conventional Galois Field (GF) multiplier.

Figure 3:
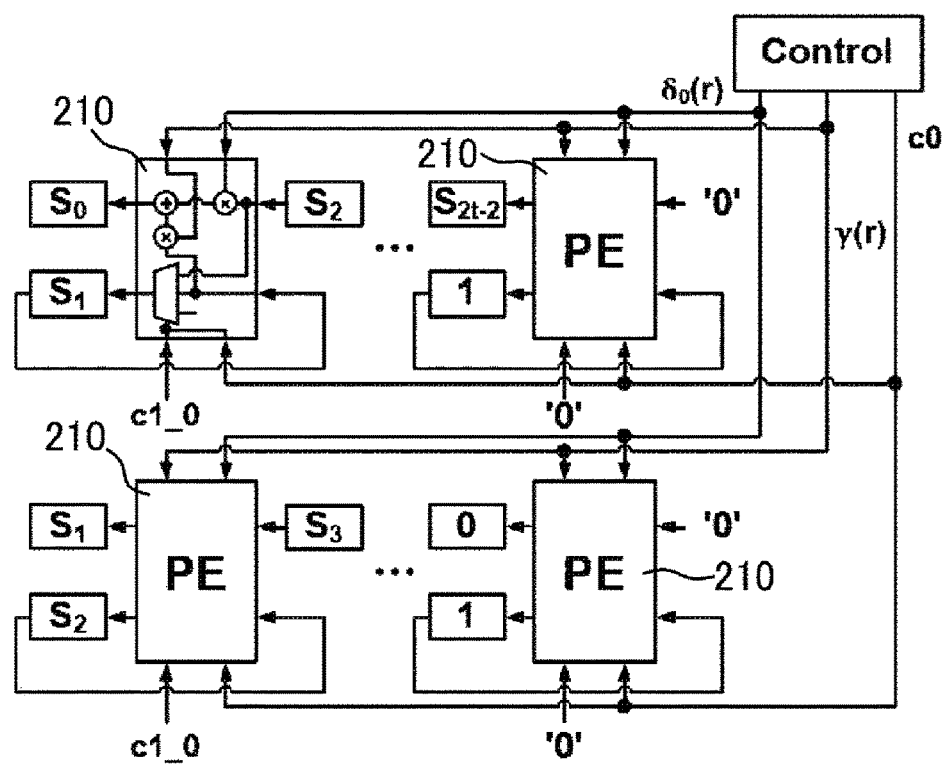
FIG. 3 is a conceptual diagram of a circuit structure of a KES within a BCH decoder.
Figure 4:
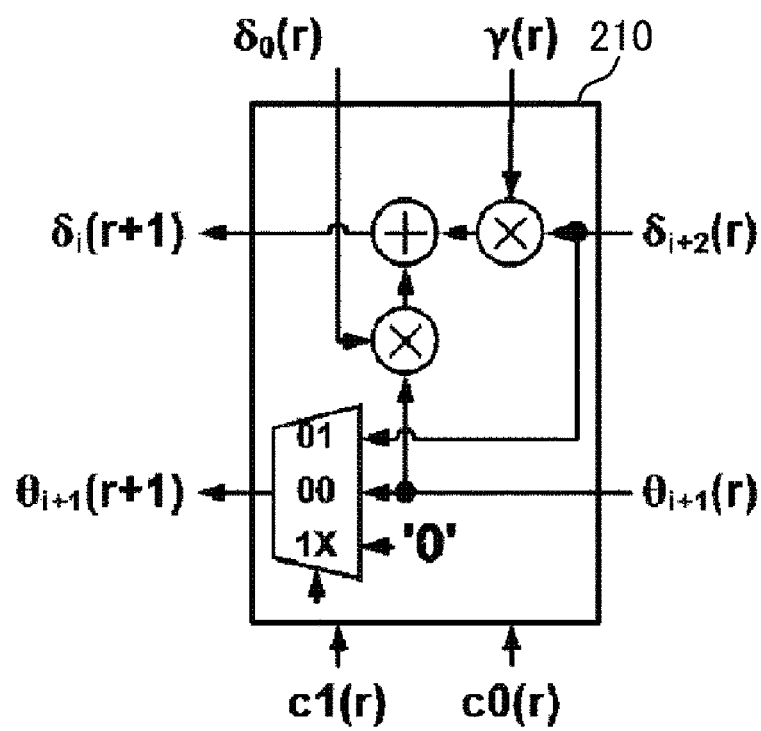
FIG. 4 is a conceptual diagram of a circuit structure of a process element (PE) constituting a KES within a BCH decoder.

Referring to FIG. 3 and FIG. 4, the key equation solver 200 may have a structure illustrated in FIG. 3.

That is, the key equation solver 200 may include multiple process elements (PE) 210. Each of the process elements 210 is a module or chip configured to calculate a key equation, and the process elements 210 are connected in parallel or in series to each other in order to process a value input from the syndrome calculator 100.

In this case, each of the process elements 210 is configured as a circuit structure illustrated in FIG. 4. To be specific, each of the process elements 210 includes two multipliers, one adder, and one MUX 212, and is configured to process input values through an internal calculation process, convert the values into output values and then output the output values to another process element 210 connected thereto.

Figure 5:
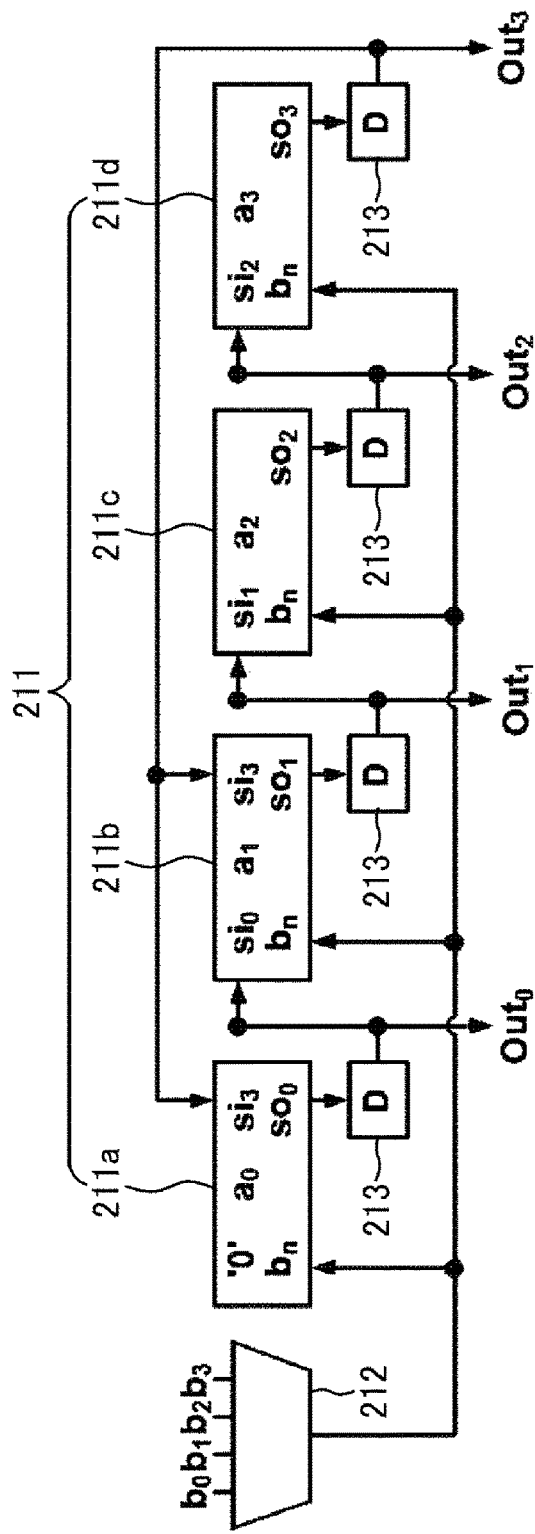
FIG. 5 is a diagram illustrating a circuit structure obtained by folding a circuit structure illustrated in FIG. 6.

In this case, each of the multipliers may include multiple calculation blocks 211, multiple flip-flops 213, and a MUX 212 as illustrated in FIG. 5.

A circuit structure illustrated in FIG. 5 is obtained by folding circuits illustrated in FIG. 6. Hereinafter, a calculation process of the circuits illustrated in FIG. 6 will be described first.

The circuits illustrated in FIG. 6 have a structure in which an output value is returned through a total of four calculation stages ① to ④. Herein, the term "calculation stage" means a step or a period of performing a calculation. Each of the calculation stages receives an output value from a previous calculation stage as an input and performs a calculation using the received output value and then returns the output value to a next calculation stage.

Herein, each of the calculation stages includes four calculation blocks 211. An output value of each calculation block 211 is in the form of $S_{ij}$ (i, j=1, 2, 3 . . . ) as described in the second column and the third row in one calculation block 211 illustrated in FIG. 6, and all of the values described in the other columns and rows are input values. Herein, the calculation block 211 means a circuit including an AND gate and an XOR gate in order to perform multiplication.

Herein, the calculation block 211 including three input values is a calculation circuit in which a coefficient of primitive polynomial element (hereinafter, referred to as "p") is 0, and the calculation block 211 including four input values is a calculation circuit in which a coefficient of primitive polynomial element is 1.

In FIG. 6, each calculation stage includes calculation blocks 211 different from each other in p. To be specific, each calculation stage includes two calculation blocks 211 in which p is 0 and two calculation blocks 211 in which p is 1.

Figure 7A:
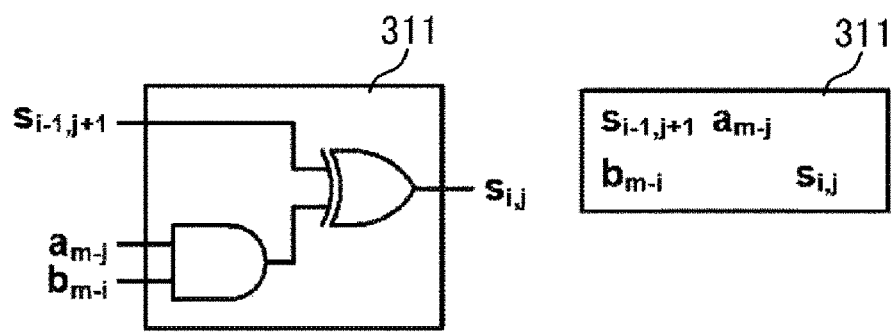
FIG. 7A and FIG. 7B are conceptual diagrams of a circuit structure of a calculation block constituting a multiplier included in a process element. Specifically.

Herein, the calculation block 211 in which p is 0 includes one AND gate and one XOR gate as illustrated in FIG. 7A. To be specific, two input values $a_{m-j}$ and $b_{m-1}$ input through two of three input ports provided in the calculation block 211 are input to the AND gate. Further, an input value $s_{i-1,j+1}$ input through the other one input port and an output value of the AND gate are input to the XOR gate. An output value of the XOR gate is output through an output port of the calculation block 211. That is, the calculation block 211 is configured such that the output value of the XOR gate is dependent on the output value of the AND gate.

Figure 7B:
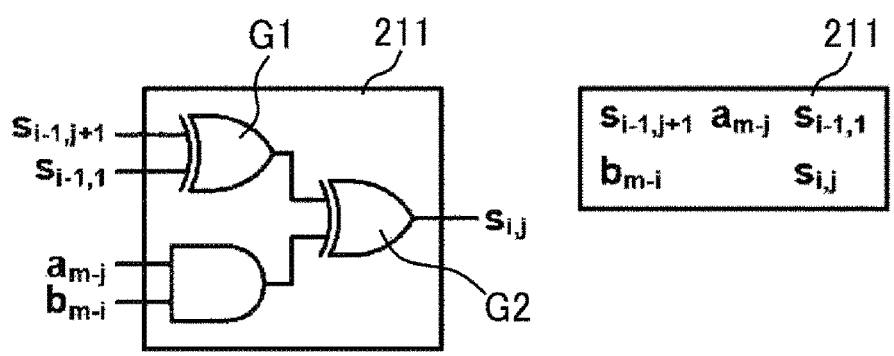

The calculation block 211 in which p is 1 includes two XOR gates and one AND gate as illustrated in FIG. 7B. To be specific, two input values $a_{m-j}$ and $b_{m-1}$ input through two of four input ports provided in the calculation block 211 are input to the AND gate. Further, input values $s_{i-1,j+1}$ and $s_{i-1,1}$ input through the other two input ports are input to a first XOR gate G1. Then, an output value of the AND gate and an output value of the first XOR gate G1 are input to a second XOR gate G2. An output value of the second XOR gate G2 is output through an output port of the calculation block 211. That is, the calculation block 211 is configured such that the output value of the second XOR gate G2 is dependent on the output values of the first XOR gate G1 and the AND gate.

Hereinafter, the calculation process of the circuit structure illustrated in FIG. 6 will be described in detail. Firstly, in a calculation stage, $b_{m-i}$ and $s_{i-1, j+1}$ are set to $b_3$ and 0, respectively, with respect to all of the calculation blocks 211. Then, with respect to all of the calculation blocks 211, $a_{m-j}$ is set to have any one value of $a_0$, $a_1$, $a_2$, and $a_3$ corresponding to each calculation block 211. Then, values $s_{1,4}$, $s_{1,3}$, $s_{1,2}$, and $s_{1,1}$ output as calculation results of the calculation stage are input to the calculation blocks 211 included in the calculation stage. Particularly, $s_{1,1}$ of the output values is input as $s_{i-1,1}$ to the calculation block 211 in which p is 1, and the other output values $s_{1,4}$, $s_{1,3}$, and $s_{1,2}$ are input as $s_{i-1,j+1}$. In the calculation stage, a calculation is performed on the basis of the input values and resultant output values are input to the calculation stage. A calculation is performed in each calculation stage in the same manner as described above except that a value of $b_{m-1}$ is changed in each calculation stage. Further, in the calculation stage, final output values $s_{4,4}$, $s_{4,3}$, $s_{4,2}$, and $s_{4,1}$ are output through an output port of the multiplier.

Hereinafter, a calculation process of the multiplier will be described in detail with reference to FIG. 5.

In FIG. 5, the MUX 212 outputs only any one value of $b_0$, $b_1$, $b_2$, and $b_3$. The MUX 212 is connected in parallel to all of the calculation blocks 211, and thus a first input value output from the MUX 212 is input to all of calculation blocks 211a to 211d at the same time. In this case, a calculation stage is determined depending on a value output from the MUX 212. To be specific, if the MUX 212 outputs $b_0$, a calculation of the calculation stage described with reference to FIG. 6 is performed. That is, the MUX 212 outputs $b_0$ and when a calculation of a calculation stage is ended, the MUX 212 outputs $b_1$ in order for a next calculation stage to perform a calculation. In this manner, the MUX 212 outputs an input value suitable for each calculation stage.

The calculation blocks 211 include a first calculation block 211a, a second calculation block 211b, a third calculation block 211c, and a fourth calculation block 211d. An example where the calculation blocks 211 include the four calculation blocks 211a to 211d is illustrated in the drawing. However, the number of calculation blocks may vary.

In this case, the first and second calculation blocks 211a and 211b are calculation blocks in which p is 1, and the third and fourth calculation blocks 211c and 211d are calculation blocks in which p is 0.

Each calculation block 211a, 211b, 211c, or 211d is connected to another calculation block such that an output value can be input as an input value of another calculation block. By way of example, an output value $so_0$ of the first calculation block 211a is input as a third input value $si_0$ of the second calculation block 211b; an output value $so_1$ of the second calculation block 211b is input as a third input value $si_1$ of the third calculation block 211c; an output value $so_2$ of the third calculation block 211c is input as a third input value $si_2$ of the fourth calculation block 211d; and an output value $so_3$ of the fourth calculation block 211d is input as a second input value $si_3$ of the first and second calculation blocks 211a and 211b. Meanwhile, unlike the other calculation blocks 211, the fourth calculation block 211d is configured such that an output value $so_3$ is input through $si_3$ input ports of the first and second calculation blocks 211a and 211b. Further, a value corresponding to any one of $a_0$, $a_1$, $a_2$, and $a_3$ is previously set as a fourth input value of each calculation block 211a, 211b, 211c, or 211d.

Meanwhile, if the first input value output from the MUX 212 is the last value (i.e., b=3), each calculation block 211 provides an output value, which is a calculation result, as a final output value of the multiplier.

The flip-flop 213 is configured to output an input value in synchronization with a clock signal. The flip-flop 213 is connected between an output port of each calculation block 211a, 211b, 211c, or 211d and an input port of another calculation block 211a, 211b, 211c, or 211d. The flip-flop 213 synchronizes output values from all of the calculation blocks 211 with a clock signal and then inputs the output values through input ports of other calculation blocks 211 at the same time. Thus, a calculation of each calculation stage can be performed smoothly. Desirably, the kind of the flip-flop 213 may be a D flip-flop.

If a circuit structure of the multiplier is configured by folding the circuit structure illustrated in FIG. 6 to be as shown in FIG. 5, a calculation of the calculation stage is ended using the four calculation blocks 211a to 211d only and then each calculation block 211 enters the calculation stage to perform a calculation. That is, due to the above-described calculation block connection structure, only the four calculation blocks 211a to 211d, the MUX 212, and the flip-flop 213 can perform the same calculation as the circuit structure including sixteen calculation blocks 211 illustrated in FIG. 16.

In the prior art as illustrated in FIG. 1, circuits of a multiplier are very irregularly aligned, and thus it is difficult to fold the multiplier. However, in the multiplier, each calculation block 211 constituting a regular combination as illustrated in FIG. 6 can perform multiplication, and the structure illustrated in FIG. 5 is achieved by folding the structure illustrated in FIG. 6. Thus, a calculation speed can be increased by shortening a critical path. Further, an operation frequency can be uniformly maintained even if a GF dimension is increased, which is very advantageous in implementation of a high-speed BCH operation. Furthermore, the number of calculation blocks 211 is minimized. Therefore, the area of the multiplier can be reduced, and, thus, the area of the BCH decoder 10 can be minimized.

The present solution can be embodied in a storage medium including instruction codes executable by a computer or processor such as a program module executed by the computer or processor. A data structure in accordance with the present solution can be stored in the storage medium executable by the computer or processor. A computer-readable medium can be any usable medium which can be accessed by the computer and includes all volatile/non-volatile and removable/non-removable media. Further, the computer-readable medium may include all computer storage. The computer storage medium includes all volatile/non-volatile and removable/non-removable media embodied by a certain method or technology for storing information such as a computer-readable instruction code, a data structure, a program module or other data.

The system and method of the present disclosure has been explained in relation to a specific embodiment, but its components or a part or all of its operations can be embodied by using a computer system having general-purpose hardware architecture.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A BCH (Bose-Chaudhuri-Hocquenghem) decoder in which a folded multiplier is equipped, the BCH decoder comprising:
   a key equation solver including a plurality of multipliers; wherein
      each of the plurality of multipliers includes a group of calculation blocks configured to perform a calculation operation,
      a MUX which is connected in parallel to each of the calculation blocks and supplies a first input value to the plurality of calculation blocks,
      a group of flip-flops connected between every two calculation blocks and configured to transfer an output value of one calculation block of the two calculation blocks as an input value of another calculation block of the two calculation blocks in synchronization with a clock signal;
   wherein the each of the plurality of multipliers performs a plurality of calculation stages which is folded on to the group of calculation blocks and the flip-flops connected to them, and one calculation stage is selected from the plurality of calculation stages depending on a value output from the MUX;
   wherein the calculation stage selected by the MUX performs the calculation operation using the group of calculation blocks and the flip-flops connected to them; and
   wherein the each of the plurality of multipliers outputs one output value on the basis of at least one input value in each calculation stage, and transfers an output value of a current calculation stage as an input value of the at least one another calculation block in a next calculation stage.

2. The BCH decoder of claim 1, wherein the each of the plurality of multipliers includes calculation blocks different from each other in a coefficient of primitive polynomial element.

3. The BCH decoder of claim 2, wherein the group of calculation blocks includes at least one calculation block of which the coefficient of primitive polynomial element is 0 and at least one calculation block of which the coefficient of primitive polynomial element is 1.

4. The BCH decoder of claim 3, wherein the number of calculation blocks of which the coefficient of primitive polynomial element is 0 is equal to the number of calculation blocks of which the coefficient of primitive polynomial element is 1.

5. The BCH decoder of claim 3, wherein
   the calculation block of which the coefficient of primitive polynomial element is 0 includes one AND gate and one XOR gate, and
   the calculation block of which the coefficient of primitive polynomial element is 1 includes one AND gate and two XOR gates.

6. The BCH decoder of claim 5, wherein
   in the calculation block of which the coefficient of primitive polynomial element is 0, an output value of the XOR gate is dependent on an output value of the AND gate, and
   in the calculation block of which the coefficient of primitive polynomial element is 1, an output value of one of the two XOR gates is dependent on an output value of the other XOR gate and an output value of the AND gate.

7. The BCH decoder of claim 1, wherein the each of the group of calculation blocks is configured as a combination of an AND gate and an XOR gate.

8. The BCH decoder of claim 1, wherein, among the group of calculation blocks,
   one calculation block of which a coefficient of primitive polynomial element is 0 is configured to input an output value as a second input value of two or more other calculation blocks, and
   the other calculation blocks except the one calculation block are configured to input an output value as a third input value of another calculation block.

9. The BCH decoder of claim 8, wherein each of the calculation blocks performs a calculation on the basis of an input value received in each of the calculation stages and a predetermined fourth input value.

10. The BCH decoder of claim 1, wherein if the first input value output from the MUX is a value for a last calculation stage, each of the calculation blocks provides an output value, which is a calculation result, as a final output value of the each of the plurality of multipliers.

* * * * *